United States Patent
Ahmadi et al.

(10) Patent No.: US 9,426,268 B2
(45) Date of Patent: Aug. 23, 2016

(54) METHOD AND APPARATUS FOR GAUGE IDENTIFICATION BASED ON SINGLE ENDED LINE TESTING (SELT)

(71) Applicant: IKANOS COMMUNICATIONS, INC., Fremont, CA (US)

(72) Inventors: Behzad Ahmadi, Parlin, NJ (US); Robin Levonas, Holmdel, NJ (US); Vipin Pathak, Eatontown, NJ (US)

(73) Assignee: Ikanos Communications, Inc., Fremont, CA (US)

( * ) Notice: Subject to any disclaimer, the term of this patent is extended or adjusted under 35 U.S.C. 154(b) by 0 days.

(21) Appl. No.: 14/807,233

(22) Filed: Jul. 23, 2015

(65) Prior Publication Data

US 2016/0028866 A1 Jan. 28, 2016

Related U.S. Application Data

(60) Provisional application No. 62/028,723, filed on Jul. 24, 2014.

(51) Int. Cl.
| | |
|---|---|
| H04M 1/24 | (2006.01) |
| H04M 3/08 | (2006.01) |
| H04M 3/22 | (2006.01) |
| G01R 31/11 | (2006.01) |
| H04M 3/30 | (2006.01) |

(52) U.S. Cl.
CPC .................. *H04M 1/24* (2013.01); *G01R 31/11* (2013.01); *H04M 3/306* (2013.01)

(58) Field of Classification Search
CPC ..... H04M 3/30; H04M 3/2209; H04M 3/306; H04M 1/24; H04M 11/062
USPC .......................... 379/1.01, 1.03, 1.04, 22.01
See application file for complete search history.

(56) References Cited

U.S. PATENT DOCUMENTS

| | | | | |
|---|---|---|---|---|
| 6,724,859 B1* | 4/2004 | Galli | ................... | H04L 25/0228 324/533 |
| 6,876,726 B1* | 4/2005 | Lechleider | ............. | H04M 3/085 379/14.01 |
| 6,914,963 B2* | 7/2005 | Peoples | ................... | H04B 3/46 379/1.01 |
| 2008/0219413 A1* | 9/2008 | Duvaut | .................. | H04M 3/302 379/3 |
| 2009/0161741 A1* | 6/2009 | Ginis | .................... | H04M 3/304 375/224 |
| 2013/0243167 A1* | 9/2013 | Drooghaag | ........... | H04M 3/306 379/27.03 |

OTHER PUBLICATIONS

ISA/KR, International Search Report and Written Opinion of the International Searching Authority, Int'l Appl. No. PCT/US2015/041775, Mar. 31, 2016, Korean Intellectual Property Office, Daejeon, KR, 18 pgs.

\* cited by examiner

*Primary Examiner* — Quoc D Tran
(74) *Attorney, Agent, or Firm* — Holland & Hart LLP

(57) ABSTRACT

The present invention relates generally to characterizing loops in a communication system, and more particularly to methods and apparatuses for loop gauge identification. In accordance with certain aspects, embodiments of the invention extract some information from the SELT signal. From SELT, the loop impedance, or equivalently input impedance, is determined. This information is then used for gauge identification.

15 Claims, 9 Drawing Sheets

METHOD AND APPARATUS FOR GAUGE IDENTIFICATION BASED ON SINGLE ENDED LINE TESTING (SELT)

CROSS-REFERENCE TO RELATED APPLICATIONS

The present application claims priority to U.S. Prov. Appln. No. 62/028,723, filed Jul. 24, 2014, the contents of which are incorporated herein by reference in their entirety.

FIELD OF THE INVENTION

The present invention relates generally to characterizing loops in a communication system, and more particularly to methods and apparatuses for loop gauge identification.

BACKGROUND OF THE RELATED ART

The subscriber loop which connects the customer premises equipment (CPE) to the central office (CO) can be affected by a wide range of impairments, including bridge taps, mixed wire gauges, bad splices, split pairs, untwisted drop cables, radio-frequency interference (RFI), and cross-talk. Although wire gauge of the loop and loop length are generally not considered actual impairments, they also have a huge impact on xDSL (i.e. ADSL, VDSL, etc.) transmission performance. Conventional methods for evaluating and qualifying a subscriber loop include the use of xDSL test units available on the market that are capable of performing such measurements. In addition, these test units are often combined with a "golden" modem plug-in module that emulates a real xDSL modem of a certain type, such as ADSL, in order to estimate the real bit rate instead of only the theoretical channel capacity. However, this approach requires sending a technician to the customer premises, which is very expensive. Meanwhile, conventional single-ended loop testing (SELT) can be used to extract information about the transmission environment and network topology in a DSL system by performing reflective measurements remotely at the CO or CPE terminal, without the need to dispatch a technician.

Regarding the problem of mixed wire gauges, in North America, the size of a copper wire is measured in American Wire Gauge (AWG) and represents the "thickness" or diameter of the copper wire. Historically, a wire gauge was determined by how much its diameter could be reduced when stepping through the wire die that was used to extrude it. So, for example, going from an 11 AWG to 12 AWG would reduce the wire diameter by a factor of about 0.89. This seems to be the limit and is still the case today.

Conventional gauge detection techniques include those that based on SELT measurements. However, a problem exists in that such techniques are interdependent on determining other features of the loop such as loop length estimation, bridge-tap location and termination detection, etc. Accordingly, a need for addressing potential problems arising from such interdependence exists.

SUMMARY OF THE INVENTION

The present invention relates generally to characterizing loops in a communication system, and more particularly to methods and apparatuses for loop gauge identification. In accordance with certain aspects, embodiments of the invention extract loop impedance information from the SELT signal. From various statistics and measures of the loop impedance, or equivalently input impedance $Z_{in}(\omega)$, gauge identification is performed.

In accordance with these and other aspects, a method for identifying a gauge of a loop according to embodiments of the invention includes receiving a reflection of a signal on the loop, the reflection having a value for each of a plurality of tones in the signal, determining a plurality of impedance values of the loop using the reflection, and identifying the gauge of the loop using the plurality of impedance values.

In additional accordance with these and other aspects, a method for identifying a gauge of a loop according to embodiments of the invention includes receiving a reflection of a signal on the loop, the reflection having a value for each of a plurality of tones in the signal, determining a plurality of impedance values of the loop using the reflection, forming an initial estimate of the gauge of the loop using the plurality of impedance values, estimating a length of the loop using the initial estimate of the gauge, and identifying the gauge of the loop using the estimated length of the loop and the plurality of impedance values.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE PREFERRED EMBODIMENTS

Figure 1:
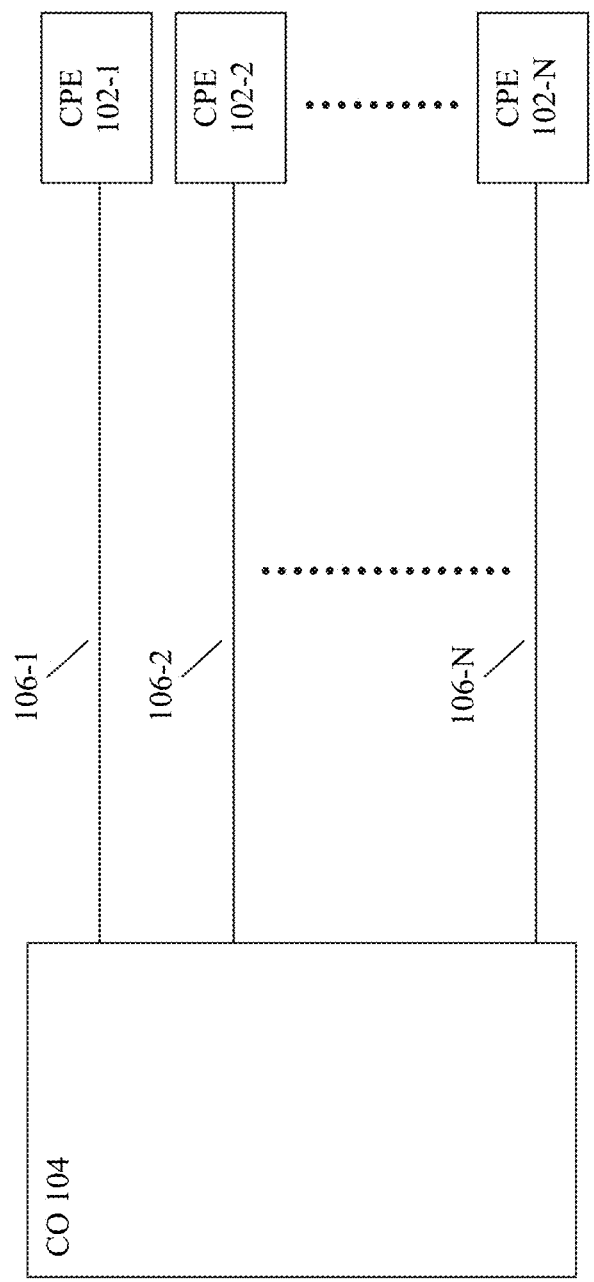
FIG. 1 is a block diagram illustrating an example xDSL system in which the principles of the invention can be implemented.

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

According to certain general aspects, the present inventors recognize that in order to minimize the unwanted expense and delay associated with sending different technicians to different portions of a xDSL loop, it is desirable that the location of the fault be identified prior to dispatching service personnel to correct the problem. As set forth above, SELT can be used to extract information about the transmission environment and network topology in a DSL system by performing reflective measurements remotely at the CO or CPE terminal, without the need to dispatch a technician. As an example, SELT may comprise injecting signals into a loop under test in order to determine the loop capability for supporting different kinds of xDSL services. Alternatively, SELT can be used to determine loop length, the location of bridge taps, and the length of bridge taps. As such, SELT often plays an important role in xDSL provisioning and maintenance.

According to certain additional aspects, the present inventors further recognize that, in order to determine all of the aforementioned impairments accurately, the wire gauge of the DSL loop should be known a priori. Therefore, gauge detection plays an important role in xDSL impairment detection modules. In addition, some cables may introduce higher impedance due to their gauge and may be candidates for being replaced with lower impedance (i.e. different gauge) cables. For this latter purpose, the xDSL provider should be aware of the current gauge of the cable and based on the obtained information the provider company may decide on a potential cable change.

FIG. 1 is a block diagram illustrating an example system 100 in which embodiments of the invention can be implemented. As shown in FIG. 1, a plurality of N CPE transceivers 102-1 to 102-N are coupled to a CO 104 via respective loops 106-1 to 106-N. In one non-limiting example, system 100 can be a DSL system operating according to VDSL2, in which certain or all of transceivers 102-1 to 102-N are configured as a vectoring group by CO 104. However, the invention is not limited to this example.

As set forth above, in wired communication systems (such as DSL, cable modem etc.) loop diagnostics are often based on analyses of SELT data. For example, CPE 102-1 or CO 104 can perform diagnostics to characterize loop 106-1 using SELT signals transmitted by CPE 102-1 or CO 104 on loop 106-1 and reflected back to CPE 102-1 or CO 104. Specifically, in an example wherein system 100 is operating according to VDSL2, a conventional SELT performed by CPE 102-1 or CO 104 can include transmitting symbols (e.g. modulated REVERB symbols) for a period of about 5 seconds to about 2 minutes, and measuring the reflections (i.e. obtaining S11 data) from loop 106-1. In VDSL2 embodiments, a pulsed wideband signal such as that described in co-pending U.S. application Ser. No. 14/339,862, the contents of which are incorporated by reference herein in their entirety, is used, comprising all upstream and downstream tones up to 17 MHz.

According to certain aspects, embodiments of the invention include methods and apparatuses incorporated in either or both of CPEs 102 and CO 104 to detect the wire gauge of loops 106 based on information extracted from the SELT measurement. Embodiments described in detail below will be provided in connection with detecting the wire gauge as being either 24-AWG or 26-AWG. However, the invention is not limited to these examples, and the principles of the invention can be extended to detecting other gauges and more than just one of two gauges.

As set forth above, one aspect of the gauge detection algorithm of embodiments of the invention is to extract information from the SELT measurement. From SELT, the loop impedance, or equivalently input impedance $Z_{in}(\omega)$, can be derived. Mathematically, input impedance is calculated using standard methods and is given by:

$$Z_{in}(\omega) = 100 \cdot \frac{1 + s_{11}(\omega)}{1 - s_{11}(\omega)},$$

in which $s_{11}(\omega)$ is the Frequency Domain Reflectometry (FDR) response of the transmitted SELT signal (i.e. $Tx(\omega)/Rx(\omega)$) and the number 100 represents the reference impedance, which is typically about 100 ohms for twisted pair cables. From the real and imaginary components of $Z_{in}(\omega)$, its absolute value $abs(Z_{in}(\omega))$ is calculated.

Figure 2:
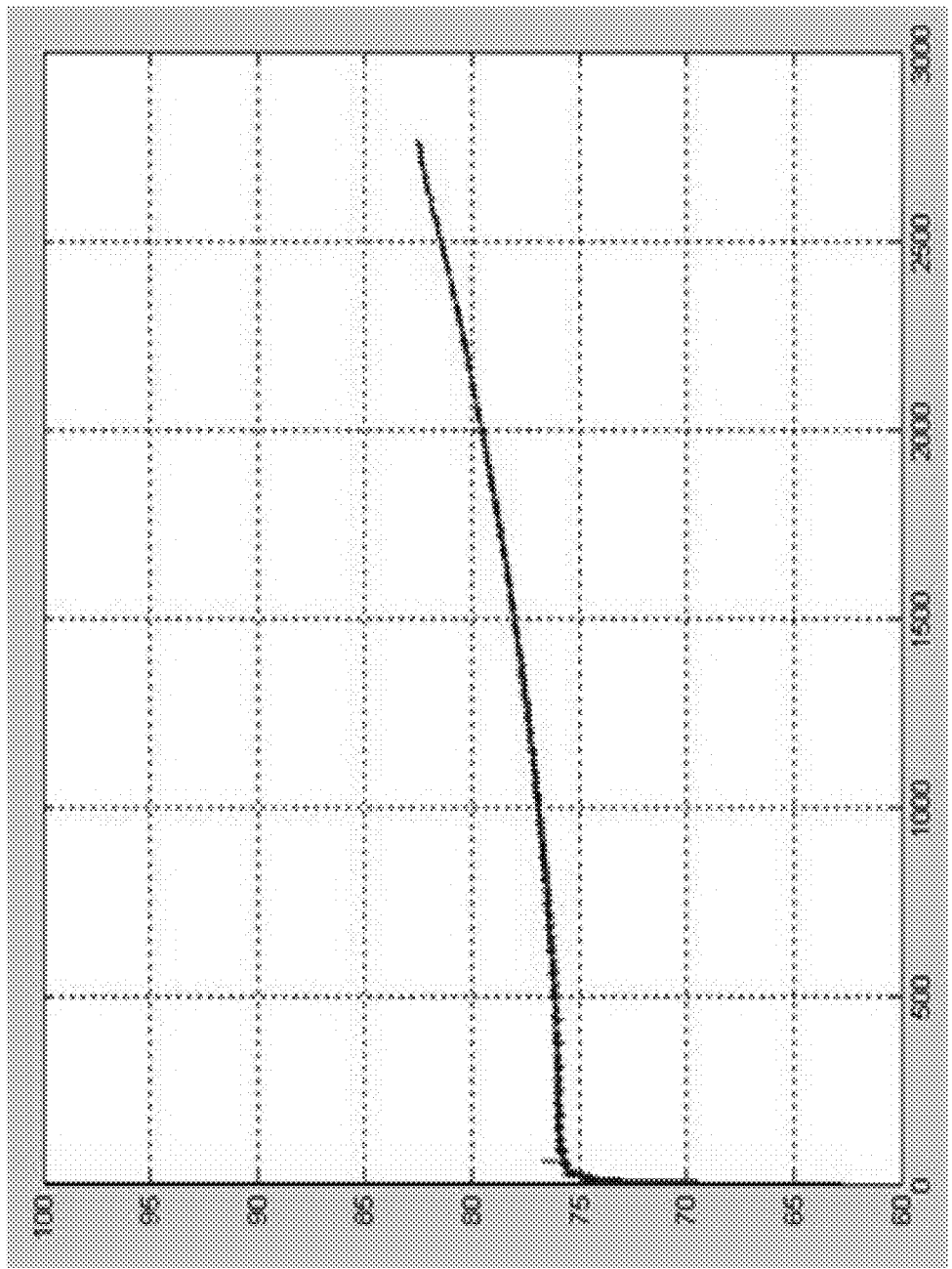
FIG. 2 is a graph showing $abs(Zin(\omega))$ versus tone for a 76 Ohm resistor connected directly to the CPE.

FIG. 2 is a plot that shows $abs(Z_{in}(\omega))$ versus tone (each tone number corresponds to a multiple of 4.3125 KHz in a VDSL example) for a line terminated by a 76Ω resistor. As can be seen from FIG. 2, $abs(Z_{in}(\omega))$ is varying with frequency but the values are close to the desired 76Ω value. Based on this experiment, $abs(Z_{in}(\omega))$ is considered as a meaningful feature to calculate the loop impedance. As shown in the picture, the input impedance $abs(Z_{in}(\omega))$ is varying with frequency (i.e. tone) but the trend of this variation is capable of revealing some information with respect to the overall impedance.

Figure 3:
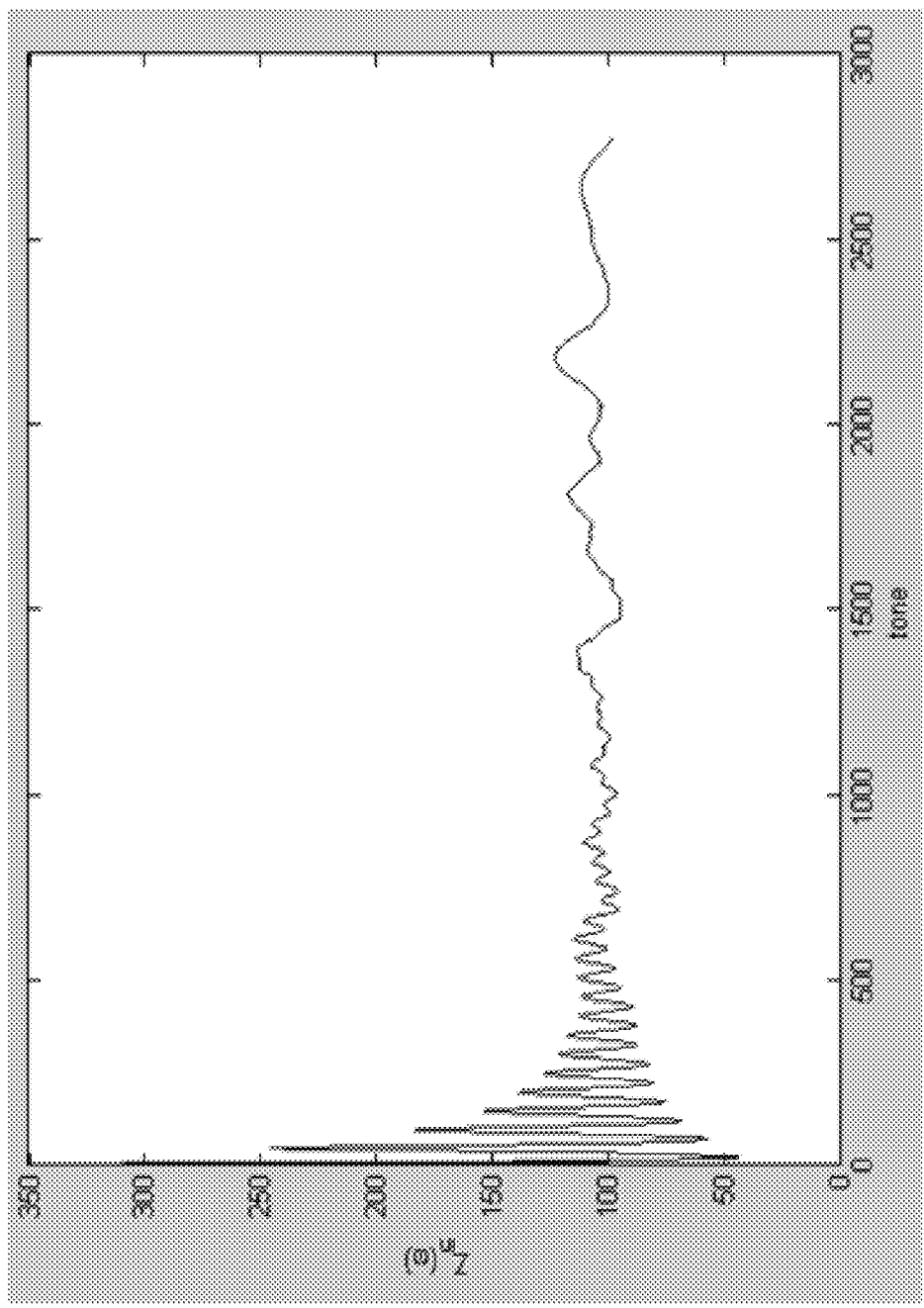
FIG. 3 is a graph showing $abs(Zin(\omega))$ versus tone for a 1500-feet 24-AWG open loop.
Figure 4:
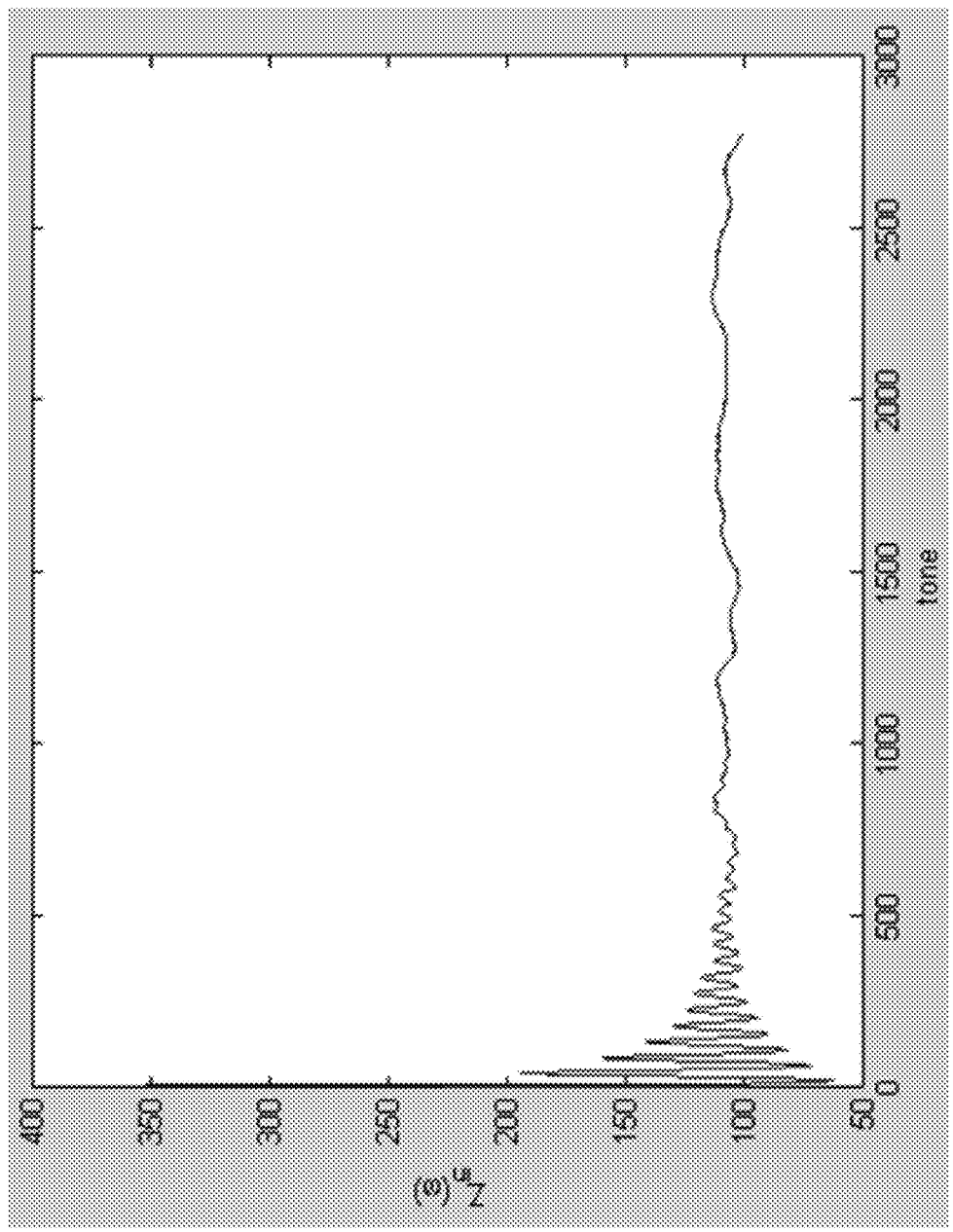
FIG. 4 is a graph showing $abs(Zin(\omega))$ versus tone for a 1500-feet 26-AWG open loop.
Figure 5:
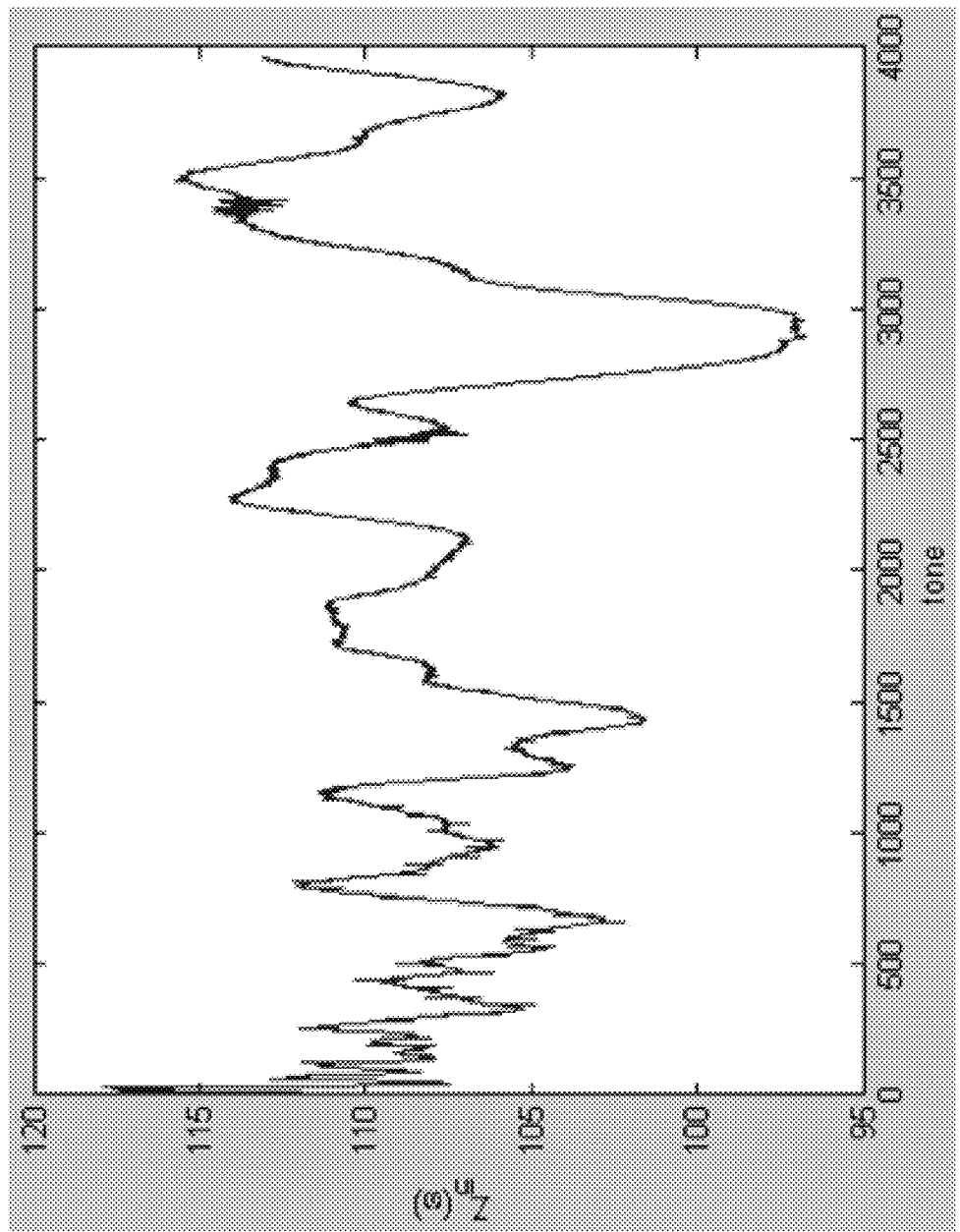
FIG. 5 is a graph showing $abs(Zin(\omega))$ versus tone for a 1500-feet 26-AWG terminated loop.

As mentioned above, an aspect of embodiments of the invention is to distinguish between 24-AWG and 26-AWG cables based on input impedance information. To provide background on how this information can be used according to the principles of the invention, FIG. 3 and FIG. 4 provide plots of $abs(Z_{in}(\omega))$ versus tone for open loops (i.e. a 1500-feet 24-AWG and a 1500-feet 26-AWG cable, respectively) and FIG. 5 provides a plot of $abs(Z_{in}(\omega))$ versus tone for a 1500-feet 26-AWG terminated loop.

An example methodology of detecting the gauge of a loop using SELT measurement data according to embodiments of the invention will now be described in connection with the flowchart in FIG. 7.

Figure 7:
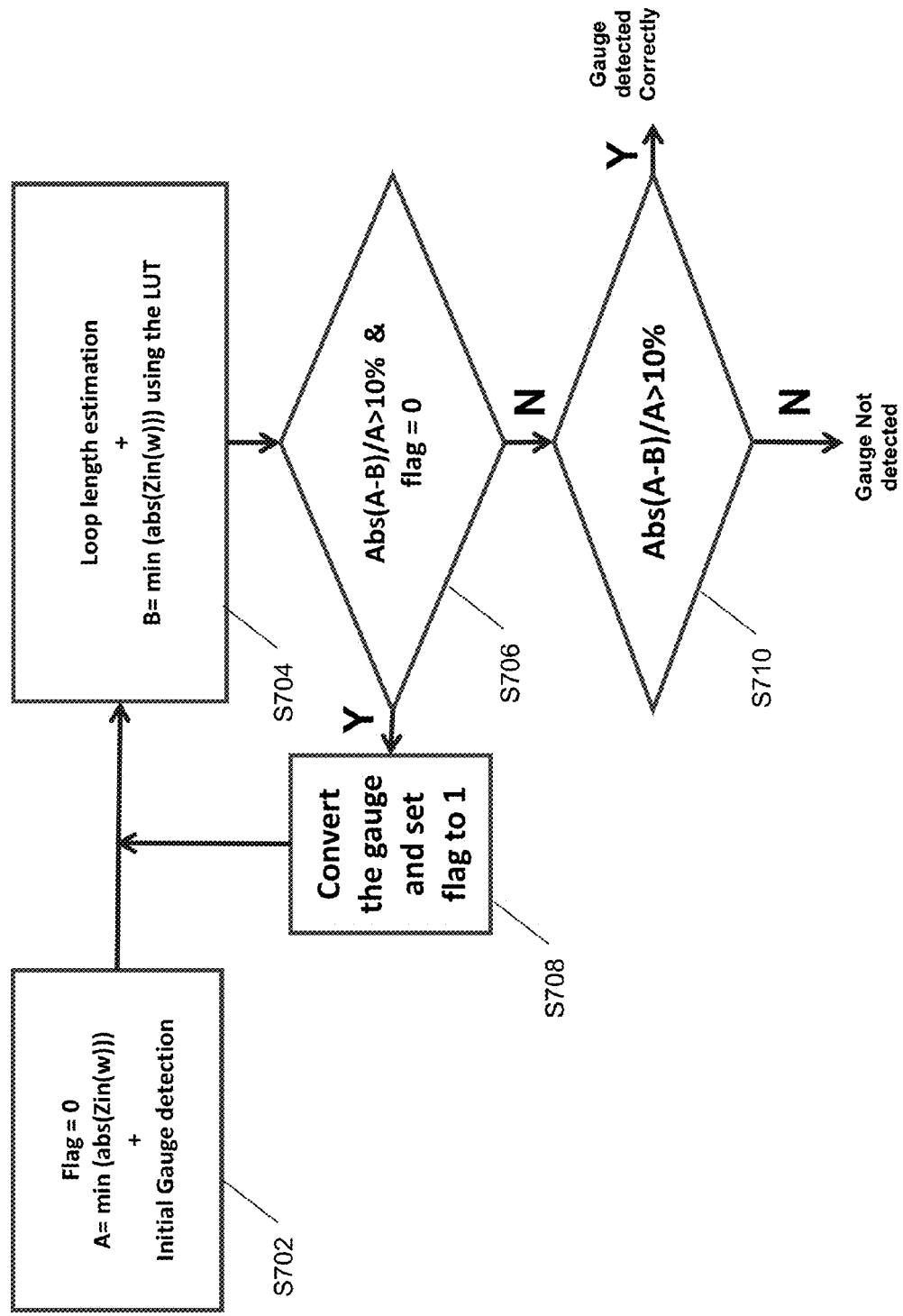
FIG. 7 is a flowchart illustrating an example gauge detection methodology according to embodiments of the invention.

As shown in the example of FIG. 7, a first step S702 includes performing an initial gauge detection.

In this first step, several statistical features are extracted from $abs(Z_{in}(\omega))$. To this end, $abs(Z_{in}(\omega))$ is averaged over all tones to obtain a value $mean_{total}$. Furthermore, the average of $abs(Z_{in}(\omega))$ is calculated over windows of width equal to 500 tones. It should be noted that $abs(Z_{in}(\omega))$ may not be available at some tones in all embodiments due to bandwidth or transceiver limitations. In one VDSL example and using the pulsed wideband SELT signal of the co-pending application, the windows for which averages of $abs(Z_{in}(\omega))$ are calculated are tones 500-1000 ($mean_{500-1000}$) tones 1000-1500

(mean$_{1000-1500}$), tones 1500-2000 (mean$_{1500-2000}$), tones 2000-2500 (mean$_{2000-2500}$), tones 2500-3000 (mean$_{2500-3000}$), tones 3000-3500 (mean$_{3000-3500}$), and tones 3500-4000 (mean$_{3500-4000}$). Also, in order to obtain more information out of abs($Z_{in}(\omega)$), the averages of larger windows of tones are also calculated, for instance over tones 500-1500 (mean$_{500-1500}$) tones 500-2500 (mean$_{500-2500}$) tones 500-4000 (mean$_{500-4000}$), and tones 2000-4000 (mean$_{2000-4000}$). As shown in the figures, abs($Z_{in}(\omega)$) has multiple ringings and fluctuations up to tone number 500, and thus this part of the spectrum is considered with less weight in the averaging process. An aspect of embodiments is to take advantage of the entire frequency band to extract an impedance characteristic of the cable.

The abs($Z_{in}(\omega)$) mean values obtained as described above are compared with respective thresholds. In embodiments, these thresholds are obtained from SELT experiments conducted using various lengths of both cables, terminated by a 100 ohm resistor, and stored in a memory accessible to the module performing the gauge detection method of the invention. Theoretically, a terminated xDSL cable should have input impedance close to 100Ω. However, if the cable is facing an impairment (such as an open termination or having a bridge tap on the loop), this impedance may increase. Having compared the presently calculated mean values for the loop under test to their respective thresholds, the final decision for this initial step is based upon a majority logic technique. In other words, a cable is detected as a 24-AWG cable if, among the mean values above, more numbers are below the threshold than above it. This algorithm is called multiple-mean algorithm.

The present inventors have discovered that the methodology described above in connection with step S702 is able to accurately detect the gauge on terminated loops longer than about 500 feet, and at this point gauge detection can be declared for such loops without further processing in some embodiments. It should be noted that additional processing can be performed in advance or in conjunction with step S702 to determine whether the loop is a terminated loop or an open/short loop. For example, the present inventors have recognized that min {abs($Z_{in}(\omega)$)} can be used to distinguish between open/short and terminated loops on loops within the range of 0 to 3200 feet. Compare, for example, the curves in FIGS. 3 and 4 to the curve in FIG. 5. In particular, based on the obtained SELT measurements, if min {abs($Z_{in}(\omega)$)} is less than 95, the loop is definitely either short or open and is not terminated. For loop lengths beyond the above range, conventional TDR or other techniques can be used to detect the loop termination. Moreover, conventional TDR or other techniques can be used to detect impairments such as bridge taps (see, e.g., co-pending U.S. application Ser. No. 14/341,538).

Returning FIG. 7, the method according to embodiments includes steps in addition to the initial detection in S702 to detect the cable gauge accurately on open/short loops.

Figure 6:
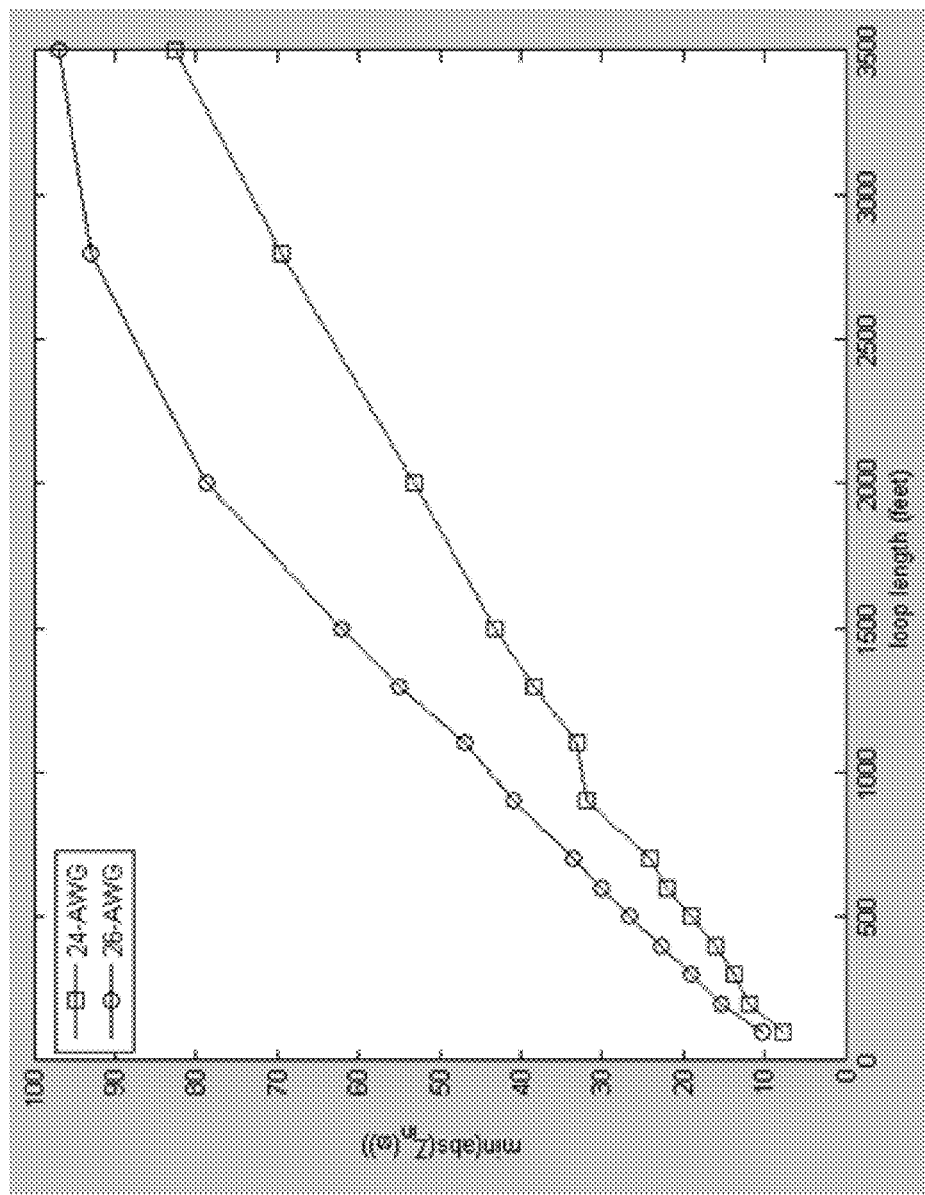
FIG. 6 is a graph showing $\min\{abs(Zin(\omega))\}$ versus loop length for 24-AWG and 26-AWG loops.

To assist in understanding the additional processing, an example of min {abs($Z_{in}(\omega)$)} versus loop length is shown in the plot of FIG. 6 for the both of gauges of interest, i.e. 24-AWG and 26-AWG. The present inventors have noted from measurements such as the curves plotted in FIG. 6 that values of min {abs($Z_{in}(\omega)$)} can be used together with loop length to determine the loop gauge, particularly for longer loop lengths. More particularly, as described above in connection with step S702, using the multiple-mean algorithm above, the initial loop gauge is detected. Furthermore in step S702, A=min {abs($Z_{in}(\omega)$)} is measured and saved.

Next in step S704, using the SELT measurement S11 data obtained previously, as well as the initial gauge estimate using the multiple-mean algorithm from step S702, a loop length estimate is performed. There are various approaches known in the art to estimate the loop length, among which are techniques based on Time Domain Reflectometry (TDR) (see, e.g., co-pending U.S. application Ser. No. 14/341,538). Further details of such approaches will be omitted here for sake of clarity of the invention.

According to certain aspects, embodiments of the invention detect the gauge using min {abs($Z_{in}(\omega)$)} values and loop length estimation by exploiting the distinction between min {abs($Z_{in}(\omega)$)} values of 24-AWG and 26-AWG loops for every value of loop length as per FIG. 6. Accordingly, in embodiments of the invention, look-up tables are prepared and stored based on min {abs($Z_{in}(\omega)$)} measured and obtained for different loop lengths and both gauges having open/short terminations. By looking up in these tables the stored value of min {abs($Z_{in}(\omega)$)} most closely corresponding to the initial gauge estimate from step S702 and the loop length estimate determined as described above, the value B=min {abs($Z_{in}(\omega)$)} is obtained from the tables.

Next in step S706, the values of A and B are compared to each other. If A and B are close enough (e.g. within 10% of each other in this example), processing advances to step S710 and the detected gauge from step S702 is deemed to be correct.

Otherwise, if this is the first time A and B have been compared in step S706 (i.e. flag=0), processing continues to step S708 where the initial gauge estimate is converted to the other gauge (i.e. if the initial gauge estimate was 24-AWG, it is converted to 26-AWG and vice-versa). Also in step S708 the flag is set to 1.

More particularly, as can be seen from FIG. 6, min {abs($Z_{in}(\omega)$)} for 24-AWG and 26-AWG cables possess values which are sufficiently different, for longer loop lengths in particular. This feature is an advantage for the methodology of embodiments of the invention because incorrect detection of the gauge (which yields in inaccurate loop length), will result in a B value which is significantly far from the actual value of A. This feature significantly helps in detecting the gauge correctly.

According to these and other aspects of the present embodiments, returning to FIG. 7, processing then proceeds to step S704 and loop length estimation is performed again as described above, but using the other gauge value. Using the new loop length estimate and the converted gauge value, a new B=min {abs($Z_{in}(\omega)$)} is obtained from the lookup tables. This new value is compared again to the initial A value in step S706. If A and B are close enough (e.g. within 10% of each other in this example), processing advances to step S710 and the converted gauge from step S708 is deemed to be correct. Otherwise, the gauge is deemed to have not been detected.

The present inventors have discovered additional or alternative processing to improve the accuracy of the example gauge detection algorithm described above in connection with FIG. 7, particularly the performance of the Multiple-Mean algorithm in step S702.

For relatively short terminated loops of 24-AWG (i.e. 700 ft. or shorter), max {abs($Z_{in}(\omega)$)} is beyond 130Ω (or a value close to this number on different boards and different band plans), while for 26-AWG cables, max {abs($Z_{in}(\omega)$)} is below 130Ω for almost any loop length. Therefore, for terminated loops with max {abs($Z_{in}(\omega)$)}≥130 ohms, the calculated mean values used in the Multiple-Mean algorithm are multiplied by a factor of 0.97 to improve the detection of 24-AWG terminated cables specifically on loops of 0 to 700 ft., while maintaining the detection of 26-AWG cables in almost the same level as before.

For 24-AWG open loops, the present inventors have likewise discovered that their max $\{abs(Z_{in}(\omega))\}$ is beyond 300Ω (or a value close to this number on different boards and different band plans) for relatively short open loops (i.e. 700 ft. or shorter). However, for 26-AWG cables, max $\{abs(Z_{in}(\omega))\}$ is below 300Ω for almost any loop length. Therefore, for open loops with max $\{abs(Z_{in}(\omega))\} \geq 300$ ohms, the calculated mean values are multiplied by a factor of 0.97 to improve the detection of 24-AWG open cables specifically on loops of 0 to 700 ft. while maintaining the detection of 26-AWG cables in almost the same level as before.

Figure 8:
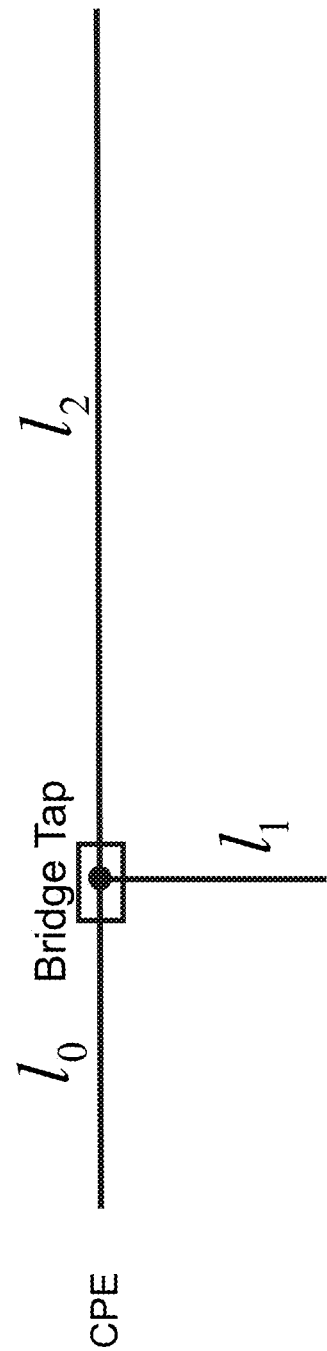
FIG. 8 illustrates a xDSL line topology in presence of bridge tap.

In order to extend the methodology described above in connection with FIG. 7 to the case of loops with a bridge tap, multiple sets of data should be collected. The present inventors have determined that if a bridge tap is far enough from the CPE, min $\{abs(Z_{in}(\omega))\}$ possesses almost the same value as if there is no bridge tap in the line. FIG. 8 is provided to explain this feature more fully. In embodiments, "far enough" is when bridge tap location is beyond half of the loop length (i.e. $l_2 \leq l_0$). Moreover, for bridge-tap that are close to the CPE (i.e. $l_0 \leq l_2$), min $\{abs(Z_{in}(\omega))\}$ decreases as bridge tap length $l_1$ decreases.

An example for various lengths of close bridge taps is given in the table below:

| $l_0$ | $l_1$ | $l_2$ | min$\{abs(Z_{in}(\omega))\}$ |
|---|---|---|---|
| 100 | 0 | 500 | 30 |
| 100 | 10 | 500 | 30 |
| 100 | 30 | 500 | 29 |
| 100 | 80 | 500 | 27 |
| 100 | 100 | 500 | 27 |
| 100 | 120 | 500 | 26 |
| 100 | 150 | 500 | 25 |
| 100 | 200 | 500 | 23 |
| 100 | 400 | 500 | 18 |

As shown above, for bridge taps close to the CPE, the impact of the bridge tap on min $\{abs(Z_{in}(\omega))\}$ is more dominant when $l_1 \geq l_0$. In order to implement a gauge detection algorithm on loops with a bridge tap, min $\{abs(Z_{in}(\omega))\}$ should be measured and stored for various combinations of bridge tap location $l_0$ and bridge tap length $l_1$. This procedure should be repeated for various loop lengths. Considering the fact that a bridge tap far from the CPE has no impact on min $\{abs(Z_{in}(\omega))\}$, the number of combinations of $l_0$ and $l_1$ for which min $\{abs(Z_{in}(\omega))\}$ should be measured will be significantly reduced. Having done that, the similar algorithm as for the case with no bridge tap should be implemented.

Figure 9:
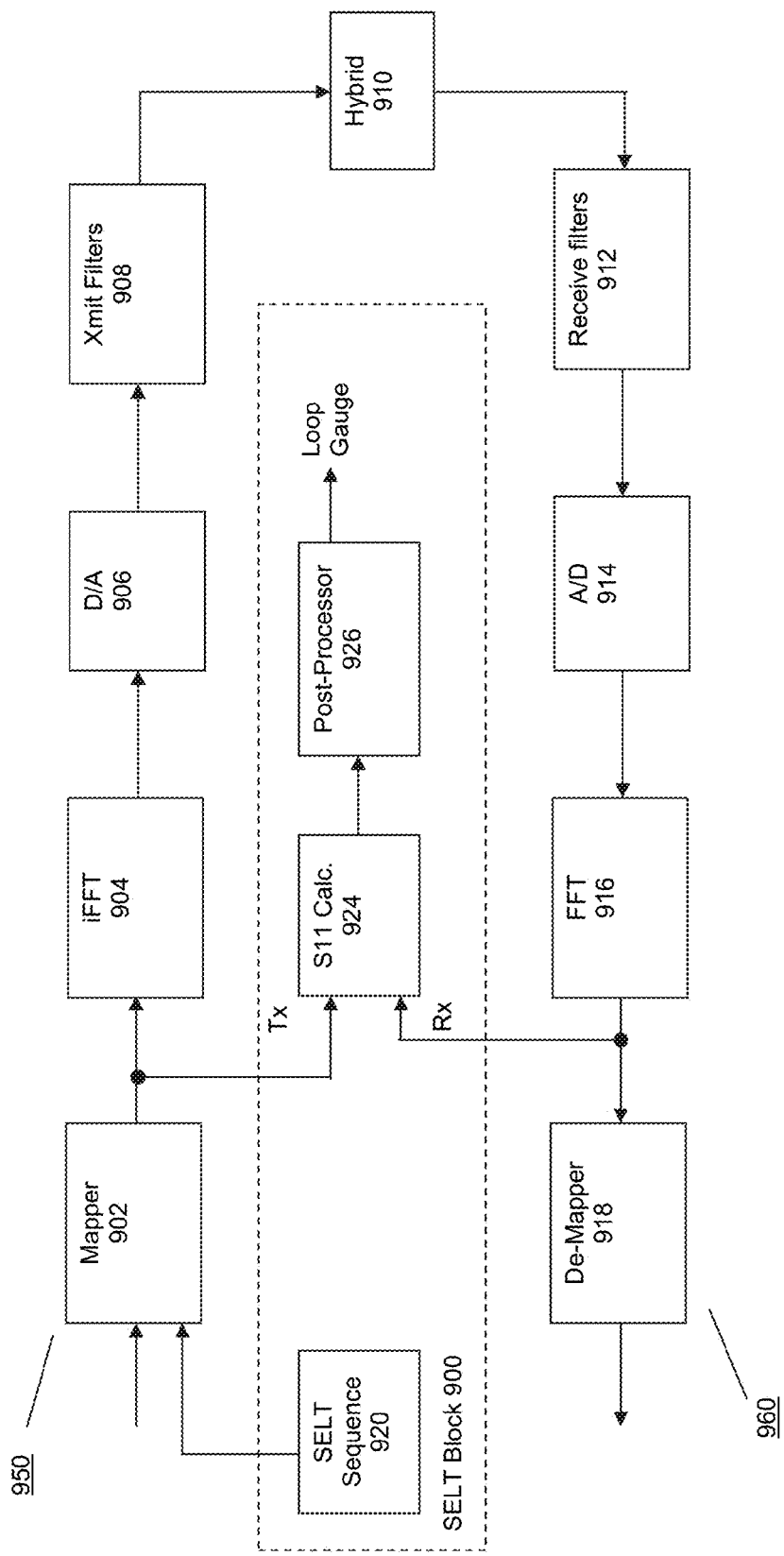
FIG. 9 is a block diagram illustrating an example apparatus including a SELT block for implementing embodiments of the invention.

To assist in understanding the above and other aspects of the invention, FIG. 9 is a block diagram illustrating an example SELT block 900 for detecting a loop gauge according to embodiments of the invention. As shown, block 900 is interposed between a transmit chain 950 and receive chain 960 of a xDSL modem. Embodiments of the invention can be implemented by xDSL modem chipsets and associated firmware such as a Vx185 platform, as well as software diagnostic suites such as Insight provided by Ikanos Communications. Those skilled in the art will understand how to implement the present invention by adapting these and other chipsets, firmware and/or software with the SELT functionality of the invention after being taught by the present examples.

It should be noted, that typical xDSL modems include many additional components than shown in FIG. 9, including controllers and other processors that can interact with the components shown in FIG. 9 such as for initiating and performing SELT tests, collecting and storing or transmitting results, etc. Such components and functionalities are well known to those skilled in the art and so additional details thereof will be omitted here for sake of clarity of the invention.

It should be further noted that apparatuses according to the invention are not limited to being incorporated in a xDSL modem as shown in FIG. 9. For example, embodiments of the invention can be incorporated in dedicated testing equipment, remote testing equipment, server side modems, etc. Moreover, embodiments of the invention can be incorporated in CPE modems or CO side modems.

As shown, block 900 according to embodiments of the invention includes a SELT sequence block 920 that causes mapper 902 to form symbols for performing SELT tests according to techniques known to those skilled in the art, or those described in the co-pending application. The symbols formed by mapper 902 (Tx) are converted to time domain by iFFT 904, and converted to analog signals by A/D 906. As shown in the example of FIG. 9, the analog signal can be optionally filtered by transmit filter(s) 908 before being transmitted onto the tip/ring connection of the modem via hybrid 910. The reflections of the transmitted signals are simultaneously sensed via hybrid 910, optionally filtered by receive filter(s) 912, digitized by A/D 914 and converted to frequency domain by FFT 916. Instead of being converted to data by de-mapper 918, the reflected symbols (Rx) are provided to S11 calculator block 924. Using the transmitted symbols (Tx) and the reflected symbols (Rx), block 924 determines the S11 signal using known techniques (e.g. S11=average of Rx/Tx for all symbols sent by SELT sequence block 920). The frequency domain S11 signal from block 924 is further processed by post-processor block 926.

As described above and shown in FIG. 9, post-processing can include determining the loop impedance Zin as is conventionally done, as well as determining the loop gauge according to aspects of the invention.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:

1. A method for identifying a gauge of a loop, comprising:
   receiving, at a central office (CO) device, a reflection of a signal on the loop, the reflection having a value for each of a plurality of tones in the signal;
   determining a plurality of impedance values of the loop using the reflection, wherein the plurality of impedance values are average impedance values over a respective plurality of windows of the plurality of tones; and
   identifying the gauge of the loop using the plurality of impedance values.

2. A method according to claim 1, wherein the loop is included in a xDSL system and the signal is a single ended line test (SELT) signal.

3. A method according to claim 2, wherein the SELT signal comprises a REVERB symbol modulating each of the plurality of tones.

4. A method according to claim 1, wherein identifying the gauge includes comparing the plurality of impedance values to a respective plurality of threshold values.

5. A method according to claim 1, wherein identifying the gauge comprises identifying the gauge as either 24-AWG or 26-AWG.

6. A method according to claim 4, wherein the respective plurality of threshold values are obtained from experiments conducted using signals reflected from loops having different gauges, and wherein identifying includes determining one of the different gauges for which the most threshold values are met by the plurality of impedance values.

7. A method according to claim 4, wherein identifying the gauge comprises identifying the gauge as either 24-AWG or 26-AWG, and wherein the respective plurality of threshold values are obtained from experiments conducted using signals reflected from loops having either 24-AWG or 26-AWG gauges, and wherein identifying includes determining the gauge for which the most threshold values are met by the plurality of impedance values.

8. A method for identifying a gauge of a loop, comprising:
   receiving, at a central office (CO) device, a reflection of a signal on the loop, the reflection having a value for each of a plurality of tones in the signal;
   determining a plurality of impedance values of the loop using the reflection, wherein the plurality of impedance values are average impedance values over a respective plurality of windows of the plurality of tones;
   forming an initial estimate of the gauge of the loop using the plurality of impedance values;
   estimating a length of the loop using the initial estimate of the gauge; and
   identifying the gauge of the loop using the estimated length of the loop and the plurality of impedance values.

9. A method according to claim 8, wherein identifying includes:
   looking up a stored value of a minimum impedance value using the estimated length and the initial estimate of the gauge;
   comparing the stored value to a minimum one of the determined plurality of impedance values; and
   identifying the gauge of the loop as the initial estimate of the gauge of the loop if the stored value and the one minimum determined value are within a threshold.

10. A method according to claim 8, wherein identifying the gauge comprises identifying the gauge as either 24-AWG or 26-AWG.

11. A method according to claim 9, wherein identifying the gauge comprises identifying the gauge as either 24-AWG or 26-AWG, and wherein if the stored value and the one minimum determined value are not within the threshold, the method further comprises:
   changing the initial estimate of the gauge of the loop to the other of either 24-AWG or 26-AWG;
   re-estimating the length of the loop using the changed initial estimate of the gauge; and
   looking up another stored value of the minimum impedance value using the re-estimated length and the changed initial estimate of the gauge;
   comparing the another stored value to the minimum one of the determined plurality of impedance values; and
   identifying the gauge of the loop as the changed initial estimate of the gauge of the loop if the stored value and the one minimum determined value are within the threshold.

12. A method according to claim 8, wherein the loop is included in a xDSL system and the signal is a single ended line test (SELT) signal.

13. A method according to claim 12, wherein the SELT signal comprises a REVERB symbol modulating each of the plurality of tones.

14. A method according to claim 8, wherein forming the initial estimate of the gauge includes comparing the plurality of impedance values to a respective plurality of threshold values.

15. A method according to claim 14, wherein the respective plurality of threshold values are obtained from experiments conducted using signals reflected from loops having different gauges, and wherein forming the initial estimate of the gauge includes determining one of the different gauges for which the most threshold values are met by the plurality of impedance values.

* * * * *